United States Patent [19]
Lee

[11] Patent Number: 6,011,712
[45] Date of Patent: Jan. 4, 2000

[54] INTERCONNECTION STRUCTURES FOR INTEGRATED CIRCUITS INCLUDING RECESSED CONDUCTIVE LAYERS

[75] Inventor: Chan-Jo Lee, Seoul, Rep. of Korea

[73] Assignee: Samsung Electronics Co., Ltd., Rep. of Korea

[21] Appl. No.: 08/982,998

[22] Filed: Dec. 3, 1997

[30] Foreign Application Priority Data

Dec. 27, 1996 [KR] Rep. of Korea ............ 96/73901

[51] Int. Cl.⁷ ................................................. G11C 11/00
[52] U.S. Cl. ............................................. 365/156; 365/51
[58] Field of Search ..................................... 365/156, 51

[56] References Cited

U.S. PATENT DOCUMENTS

| | | | |
|---|---|---|---|
| 4,649,625 | 3/1987 | Lu ............................ | 29/571 |
| 4,984,196 | 1/1991 | Tran et al. .................. | 365/51 |
| 5,064,777 | 11/1991 | Dhong et al. ............... | 437/52 |

*Primary Examiner*—David Nelms
*Assistant Examiner*—M. Tran
*Attorney, Agent, or Firm*—Myers Bigel Sibley & Sajovec

[57] ABSTRACT

Interconnection structures for integrated circuits include first and second spaced apart active regions in an integrated circuit at a face thereof and a recessed isolation region in the integrated circuit, between the first and second spaced apart active regions and recessed beneath the face. A first conductive layer is included on the recessed isolation region. The first conductive layer extends between the first and second spaced apart active regions beneath the face, and electrically connects the first and second spaced apart active regions beneath the face. Accordingly, high density isolation regions and interconnection regions for the first and second spaced apart active regions are provided. A second conductive layer is preferably included on the face, extending from on the first active region onto the first conductive layer and onto the second active region. The interconnect structures may be formed by forming an isolation region in a face of an integrated circuit substrate, and first and second spaced apart active regions in the integrated circuit substrate at the face. A portion of the isolation region is removed, to form a recessed isolation region. A first conductive layer is formed on the recessed isolation region such that the first and second spaced apart regions and the first conductive layer are electrically interconnected beneath the face. A second conductive layer is formed on the face, extending from on the first active region onto the first conductive layer and onto the second region.

25 Claims, 14 Drawing Sheets

INTERCONNECTION STRUCTURES FOR INTEGRATED CIRCUITS INCLUDING RECESSED CONDUCTIVE LAYERS

FIELD OF THE INVENTION

This invention relates to integrated circuits such as integrated circuit memory devices and methods of fabricating the same, and more particularly to interconnection structures for connecting active devices in integrated circuits such as integrated circuit memory devices and methods of fabricating the same.

BACKGROUND OF THE INVENTION

Integrated circuits such as integrated circuit memory devices generally continue to increase in integration density. With increasing integration density, each active device such as a transistor generally decreases in area. In order to maintain increasing integration densities, it is also generally desirable for the isolation regions that isolate active devices from one another, to also shrink in size. Moreover, as integration densities continue to increase, and the number of active devices in an integrated circuit continue to increase, the interconnection or wiring between active devices may also limit the integration density. Accordingly, it is also desirable to decrease the size of the interconnections in the integrated circuit.

One example of an integrated circuit is a Static Random Access Memory (SRAM) device. As is well known to those having skill in the art, an SRAM includes an array of memory cells that can store data without the need to refresh the cells. As the number of cells that are integrated in an integrated circuit continues to increase, the area in an integrated circuit that is taken up by a unit memory cell generally continues to decrease. As the integration density continues to increase, it is also generally desirable for the power consumption of each cell to also decrease. Finally, it is also desirable for the operation and speed of each unit cell to increase.

In order to provide high integration density, low power consumption and high speed operation, a complementary transistor SRAM cell has been proposed. A complementary transistor SRAM cell, also referred to as a CMOS SRAM cell, uses a pair of cross-coupled CMOS inverters to store data.

Unfortunately, since the CMOS SRAM cell uses complementary transistors in a single unit cell, separate n-wells and p-wells are generally used for each unit cell. Since separate wells are used, it is generally desirable to also provide an isolating region to isolate the n-well from the p-well. Unfortunately, the isolating region may increase the unit cell size. Moreover, in order to provide the cross-coupled inverters, a pair of storage nodes generally are provided internal to the cell. The internal cell wiring including the storage nodes may also increase the cell size.

Referring now to FIG. 1A, a conventional CMOS SRAM cell is shown. The SRAM cell includes a pair of CMOS inverters. The first CMOS inverter comprises an n-channel MOS transistor 20a and a p-channel MOS transistor 21a. The second CMOS inverter includes n-channel MOS transistor 20b, and p-channel MOS transistor 21b. The first and second CMOS inverters are cross-coupled by connecting the gates of the MOS transistors 20a and 21a to a storage node 25b that is also connected between the source/drain regions of MOS transistors 20b and 21b. Similarly, the gates of the MOS transistors 20b and 21b are connected to a storage node 25a between the source/drain regions of MOS transistors 20a and 21a.

Continuing with the description of FIG. 1A, the sources of the p-channel MOS transistors 21a and 21b are connected to a power supply voltage VCC and the sources of the n-channel MOS 20a and 20b are connected to ground voltage VSS. The storage nodes 25a and 25b are connected to n-channel transfer transistors 22a and 22b, respectively. The transfer transistors are also referred to as pass transistors. The gates of the transfer transistors 22a and 22b are connected to a word line WL and the respective drains thereof are connected to complementary bit lines BL and BLB. Thus, complementary data is stored at storage nodes 25a and 25b, without the need to refresh the cell.

Referring now to FIG. 1B, a cross-section of a storage node 25a or 25b of FIG. 1A is illustrated. As shown, a source/drain region 110 of an n-channel MOS transistor 20a (or 20b) is formed in a p-well region of an integrated circuit substrate such as a semiconductor substrate 100. A source/drain region 113 of a p-channel MOS transistor 21a (or 21b) is formed in an n-well region of semiconductor substrate 100. The source/drain regions 110 and 113 are isolated from each other by an isolation region 101. Isolation region 101 may be formed by LOCal Oxidation of Silicon (LOCOS) or other conventional techniques. A gate insulating layer 40, a gate electrode 50, a capping insulating layer 60 and a gate sidewall spacer 70-1 may also be provided.

Still referring to FIG. 1B, an interlayer dielectric layer 150 is provided. A metal layer 160 connects the drain 110 of MOS transistor of 20a (or 20b) to the drain 113 of MOS transistor 21a (or 21b) to form the storage node 25a (or 25b). Accordingly, as shown in FIG. 1B, a conventional CMOS SRAM cell may have a large unit cell size because n-wells and p-wells are formed in each unit cell. The isolation region 101 and the internal wiring layer 160 may consume excessive unit cell area and may limit denser integration of the SRAM unit cell.

SUMMARY OF THE INVENTION

It is therefore an object of the present invention to provide compact isolation and interconnection structures for integrated circuits, and methods of fabricating the same.

It is another object of the present invention to provide compact complementary transistor structures for integrated circuits and methods of fabricating the same.

It is yet another object of the present invention to provide storage nodes for integrated circuit memory cells that can consume small amounts of integrated circuit area, and methods of fabricating the same.

It is still another object of the present invention to provide high density integrated circuit memory cells such as SRAM cells, and methods of fabricating the same.

These and other objects are provided according to the present invention by interconnection structures for an integrated circuit that include first and second spaced apart active regions in an integrated circuit at a face thereof and a recessed isolation region in the integrated circuit, between the first and second spaced apart active regions and recessed beneath the face. A first conductive layer is included on the recessed isolation region. The first conductive layer extends between the first and second spaced apart active regions beneath the face, and electrically connects the first and second spaced apart active regions beneath the face. Accordingly, high density isolation regions and interconnection regions for the first and second spaced apart active regions may be provided.

According to another aspect of the present invention, a second conductive layer is included on the face, extending from on the first active region onto the first conductive layer and onto the second active region. The second conductive layer can also provide improved interconnection between the first and second active areas.

In preferred embodiments of the present invention, the first conductive layer preferably comprises a doped polysilicon layer and the second conductive layer preferably comprises a metal layer, preferably a silicide layer. The recessed isolation region preferably comprises a recessed oxide-filled trench.

Accordingly, a complementary transistor structure for an integrated circuit is provided by a recessed isolation region in an integrated circuit between an n-channel transistor and a p-channel transistor. The recessed isolation region is recessed beneath the face of the integrated circuit. A first conductive layer is included on the recessed isolation region, extending between the n-channel transistor and the p-channel transistor beneath the face, and electrically connecting the n-channel transistor and the p-channel transistor beneath the face. A second conductive layer is included on the face, extending from the n-channel transistor onto the first conductive layer and onto the p-channel transistor. The n-channel transistor and the p-channel transistor may form an inverter, a pair of which are cross-coupled to produce an SRAM cell. The first and second conductive layers form a storage node for the integrated circuit memory cell.

Interconnection structures of integrated circuits such as SRAM devices may be formed, according to the present invention, by forming an isolation region in a face of an integrated circuit substrate, and forming first and second spaced apart active regions in the integrated circuit substrate at the face. A respective one of the first and second spaced apart active regions is on a respective opposite side of the isolation region. It will be understood that the first and second spaced apart active regions may be formed prior to forming the isolation region, or the isolation region may be formed prior to forming the first and second spaced apart active regions. The first and second spaced apart active regions may be formed by implanting ions into the substrate face, using the isolation region as a mask. The ions may be obliquely implanted. The first and second spaced apart regions may be formed after the step of forming the first conductive layer as well.

A portion of the isolation region is removed from the face of the integrated circuit to form a recessed isolation region beneath the face. The ions may be obliquely planted after removal of the portion of the isolation region. A first conductive layer is formed on the recessed isolation region, such that the first and second spaced apart regions and the first conductive layer are electrically interconnected beneath the face.

A second conductive layer is formed on the face, extending from on the first active region onto the first conductive layer and onto the second active region. The first conductive layer is preferably a doped polysilicon plug, and the second conductive layer is preferably a metal layer, more preferably a metal silicide layer.

Accordingly, high density isolation and interconnection structures may be provided for integrated circuits, such as integrated circuit SRAM devices.

DETAILED DESCRIPTION OF PREFERRED EMBODIMENTS

Figure 1A:
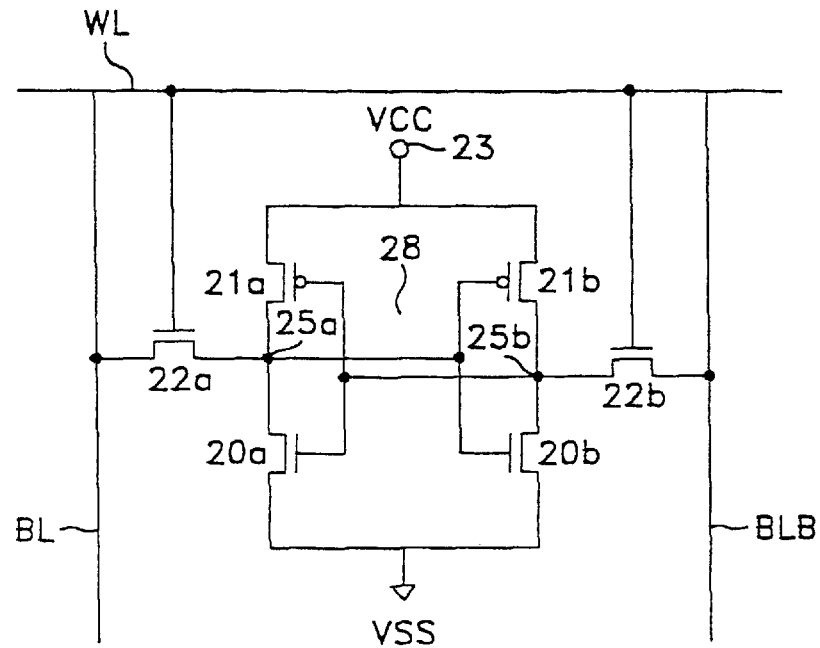
FIG. 1A is a circuit diagram of a conventional CMOS SRAM cell.
Figure 1B:
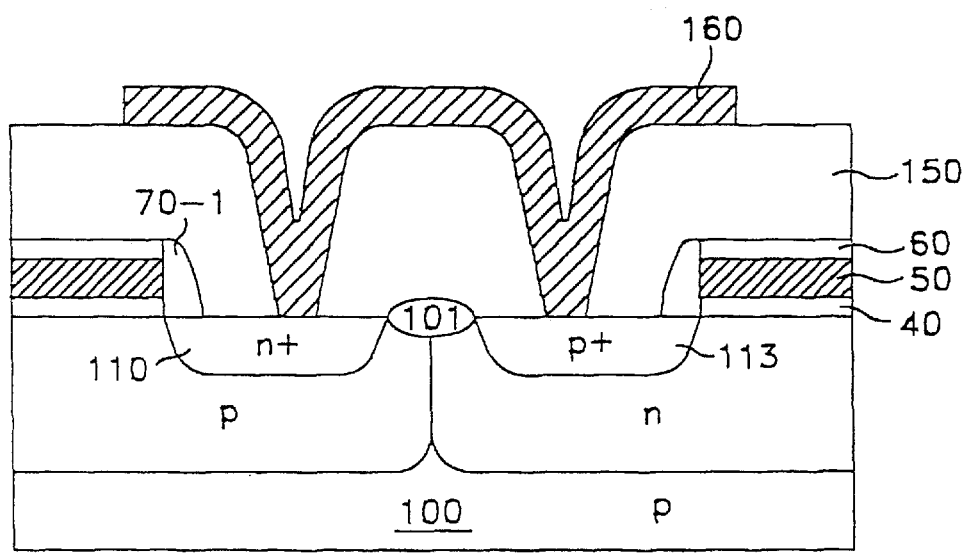
FIG. 1B is a cross-sectional view of a storage node of an SRAM cell of FIG. 1A.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer, region or substrate, it can be directly on the other layer, region or substrate, or intervening layers or regions may also be present. Moreover, each embodiment described and illustrated herein includes its complementary conductivity type embodiment as well.

Referring now to FIGS. 2–16, cross-sectional views of interconnection structures for integrated circuits are illustrated, during intermediate fabrication steps. Although a storage node of a CMOS SRAM cell is illustrated, it will be understood that the interconnection and isolation structures may be used in other integrated circuit devices as well.

Figure 2:
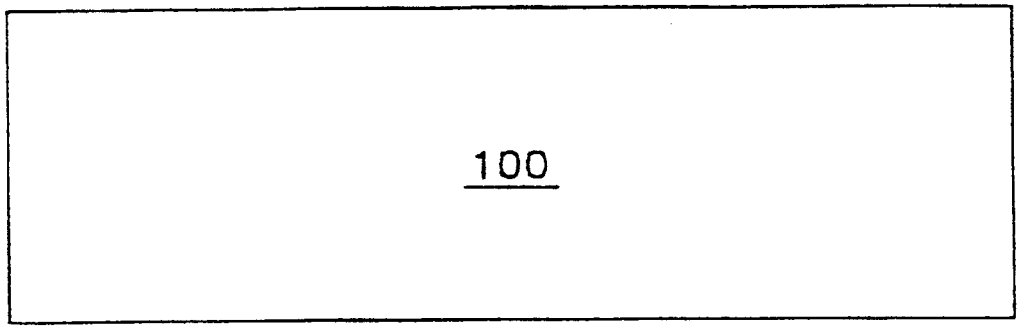
FIGS. 2–16 are cross-sectional views illustrating fabrication of isolation and interconnection structures for storage nodes of CMOS SRAM cells according to the present invention.
Figure 3:
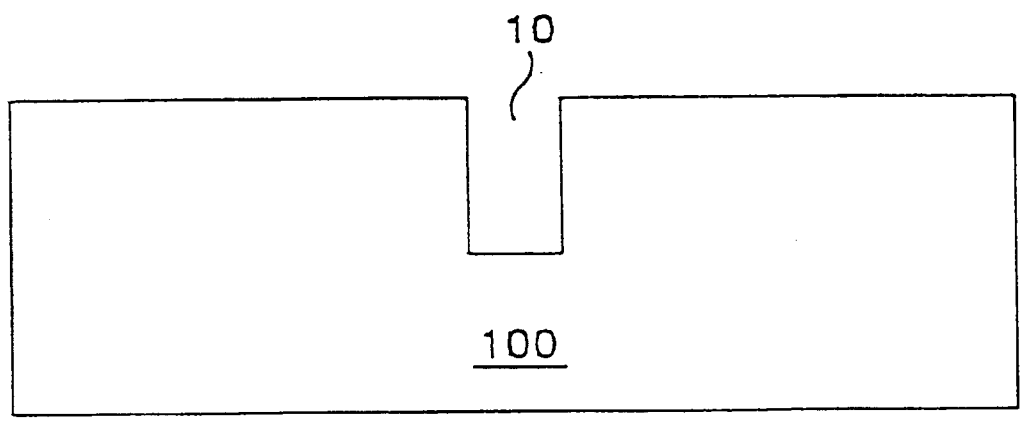
Figure 4:
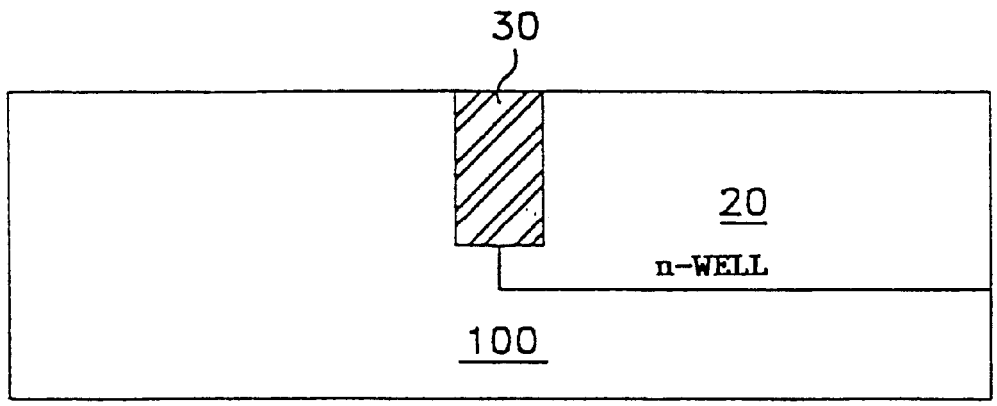

As shown in FIG. 2, an integrated circuit substrate, such as a p-type silicon substrate 100 is provided. In FIG. 3, a trench 10 is formed in a face of the substrate 100. As shown in FIG. 4, the trench is filled with an oxide layer 30 to form an isolating region. N-type ions are implanted into a selected portion of the p-type substrate 100 to form an n-well 20. Formation of an oxide isolated trench and an n-well are well known to those having skill in the art and need not be described further herein.

Figure 5:
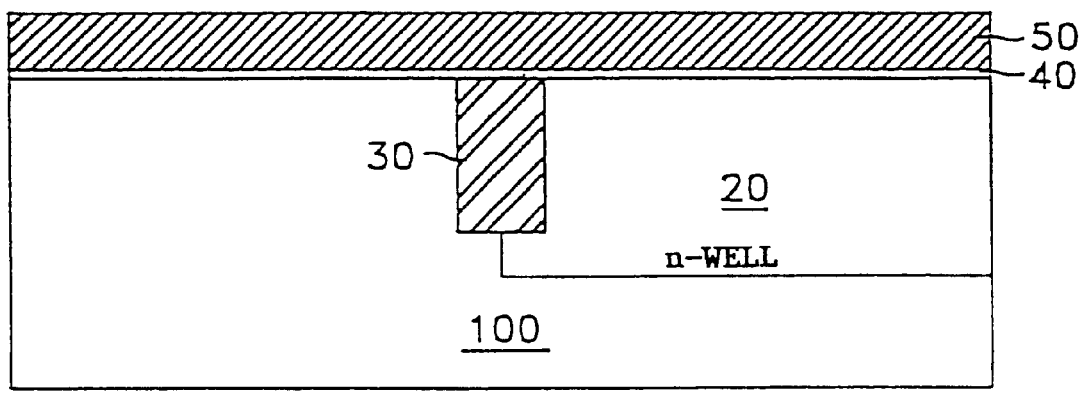
Figure 6:
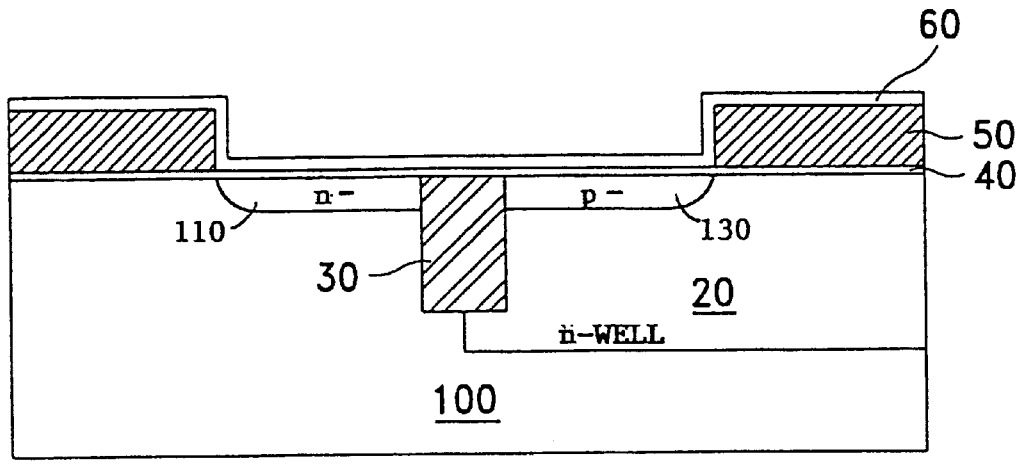

Referring now to FIG. 5, a gate oxide layer 40 and a gate polysilicon layer 50 are formed on the substrate face using conventional techniques. In FIG. 6, the gate polysilicon layer 50 is etched in order to form spaced apart gates for field effect transistors. After patterning the gates, an n-type active region 110 and a p-type active region 130 are formed using conventional lightly doped drain implantation processes. Then, an oxide layer 60 is formed on the face including on the gates 50.

Figure 7:
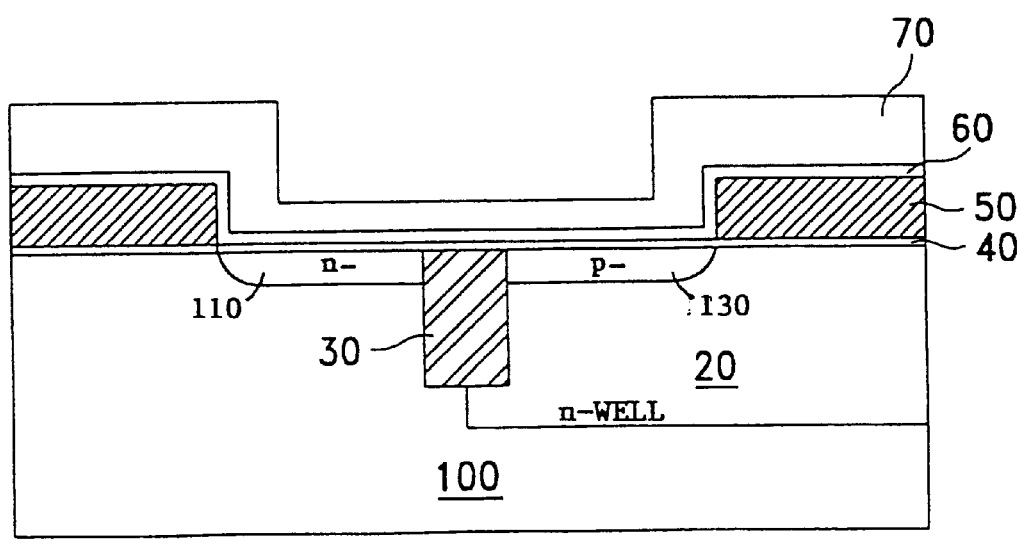
Figure 8:
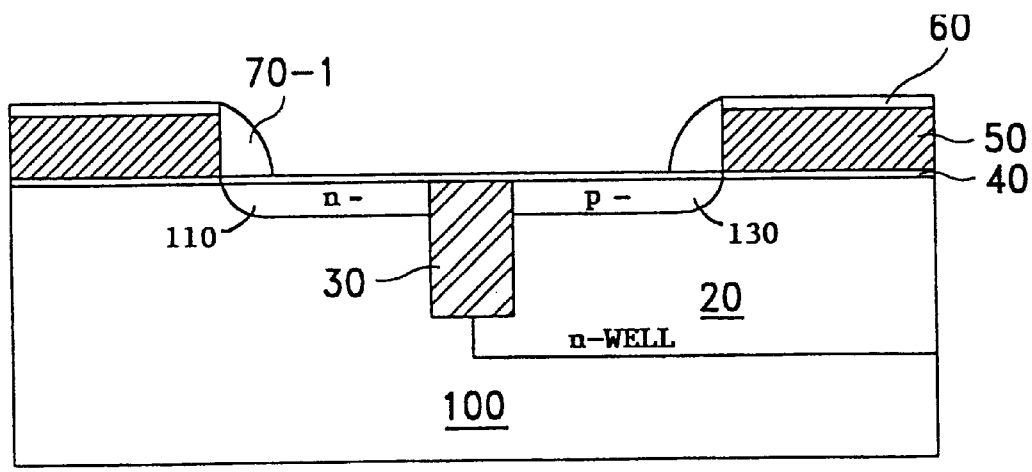

Referring now to FIG. 7, a silicon nitride layer 70 is formed on the oxide layer 60. As shown in FIG. 8, the silicon nitride layer 70 is etched to form sidewall spacer 70-1. Formation of sidewall spacers is well known to those having skill in the art and need not be described further herein.

Figure 9:
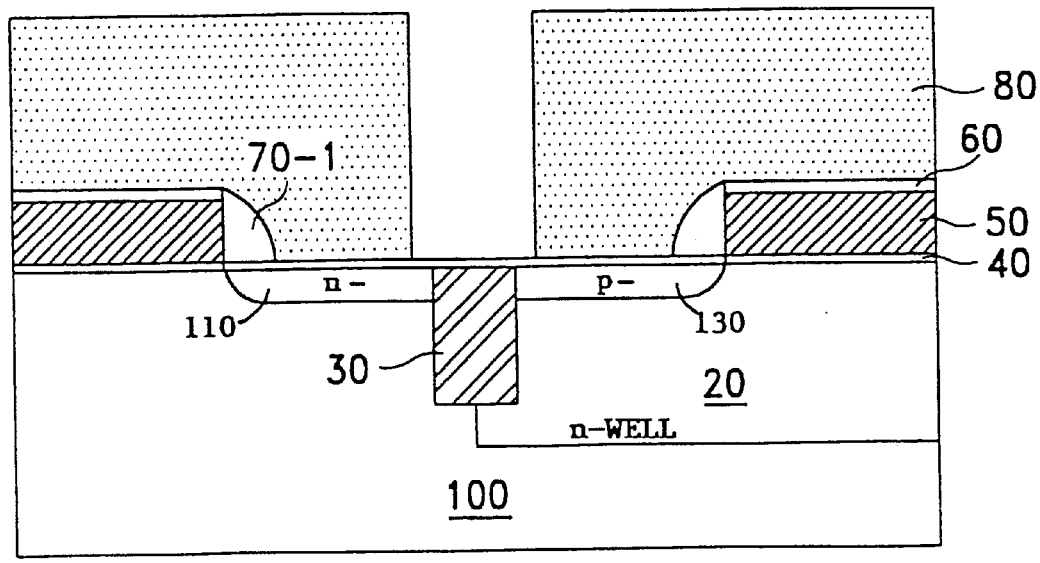
Figure 10:
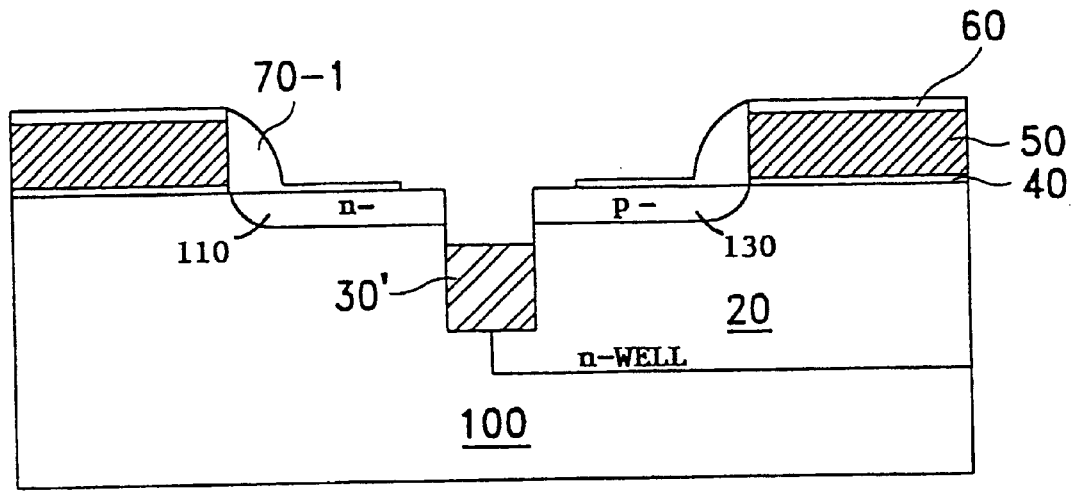
Figure 11:
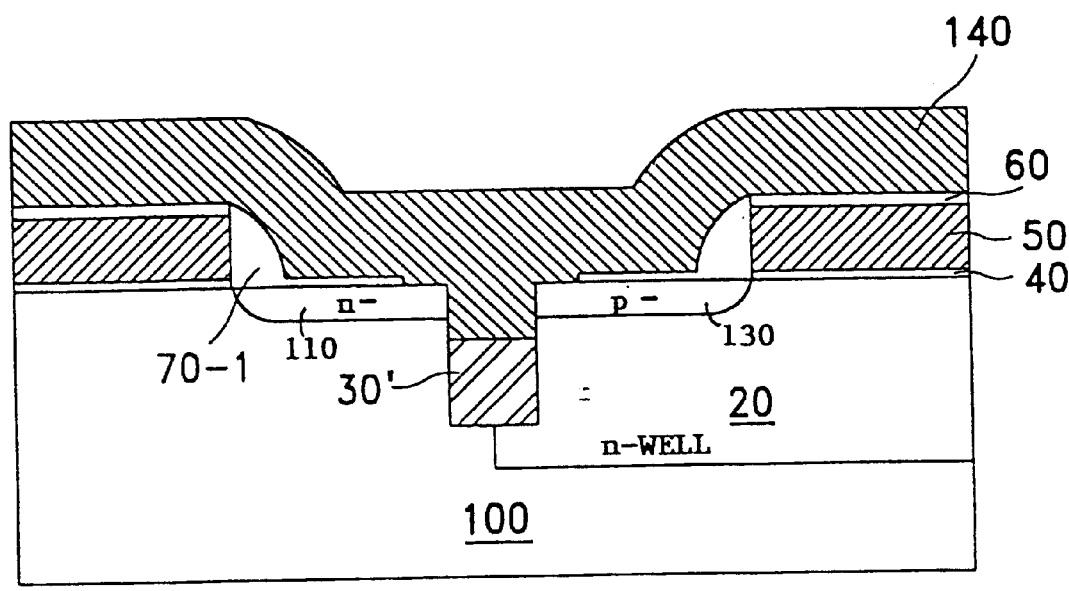

Referring now to FIG. 9, a photoresist layer is formed and patterned to cover the gate regions 50 but to expose the isolation region 30. Then, as shown in FIG. 10, the isolation region is partially etched from the face of the integrated circuit, to form a recessed isolation region 30' beneath the face. The photoresist layer 80 is then removed. Then, as shown in FIG. 11, a polysilicon layer 140 is formed on the integrated circuit. The polysilicon layer 140 is a doped polysilicon layer so that it is conductive.

Figure 12:
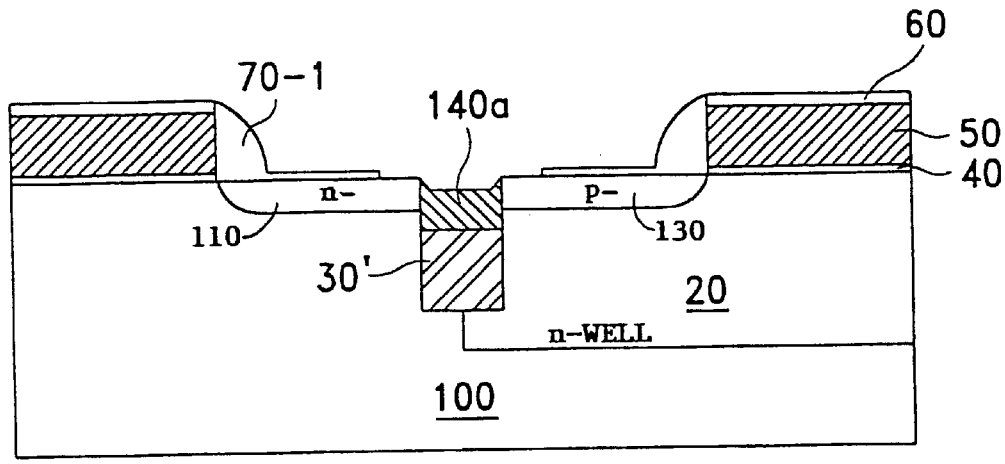

As shown in FIG. 12, the polysilicon layer 140 is etched back so as to form a first conductive layer, in the form of a polysilicon plug 140a, on the recessed isolation region 30', extending between the first and second active regions 110 and 130 beneath the substrate face, and electrically connecting first and second spaced apart active regions beneath the substrate face.

Figure 13:
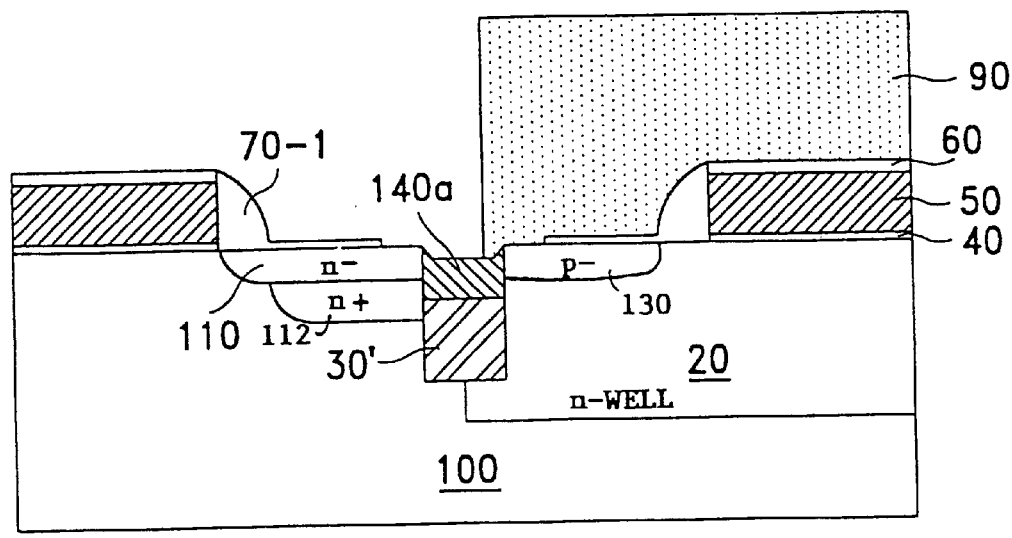
Figure 14:
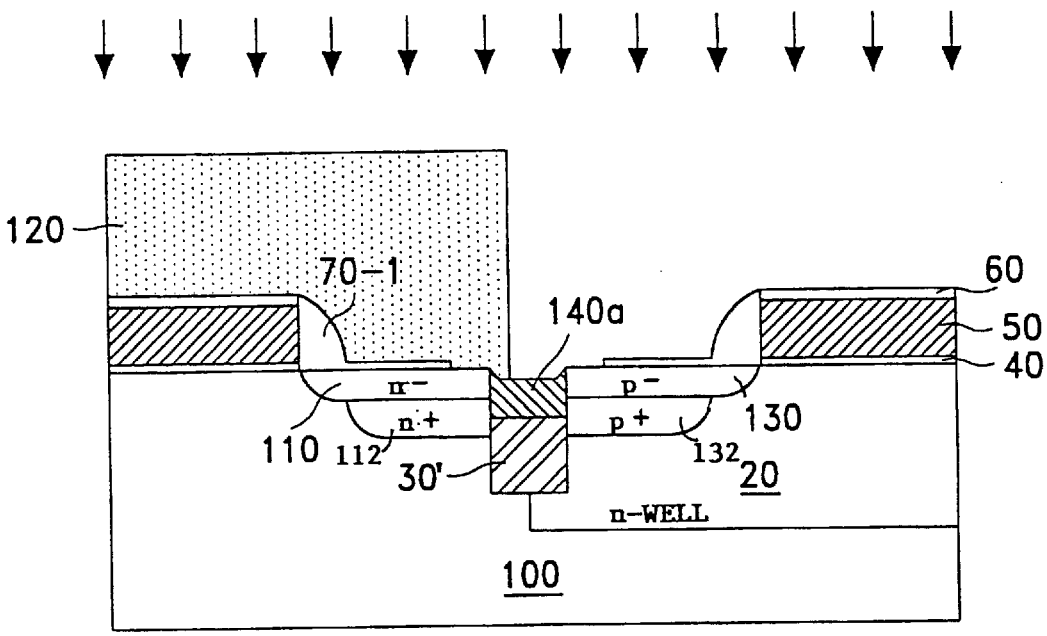

Referring now to FIG. 13, a photoresist layer 90 is formed on the n-well 20. n-type impurities such as phosphorus (P) or arsenic (As) ions are implanted into the substrate, using the photoresist layer 90 as a mask, to form an $N^+$-type active region 112. Then, in FIG. 14, the photoresist layer 90 is removed and a second photoresist layer 120 is formed on the n-type active region 110. Also, p-type dopants open such as boron (B) or indium (In) are implanted into n-well 20 using the photoresist layer 120 as a mask, to form a $P^+$-type active region 132.

Figure 15:
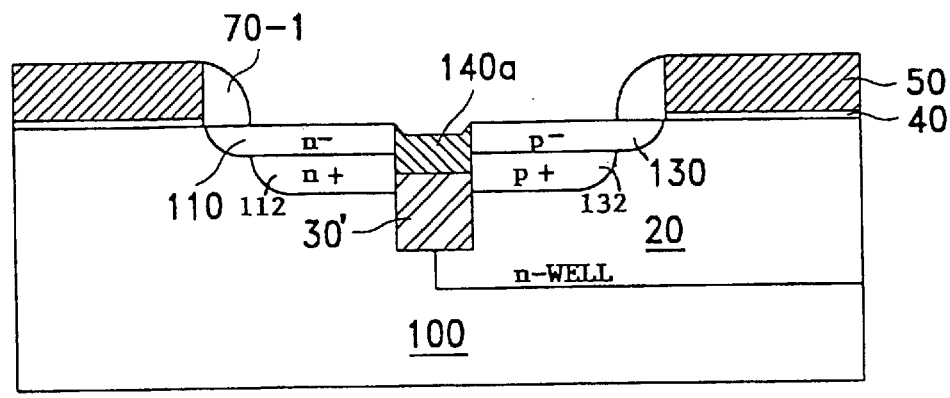
Figure 16:
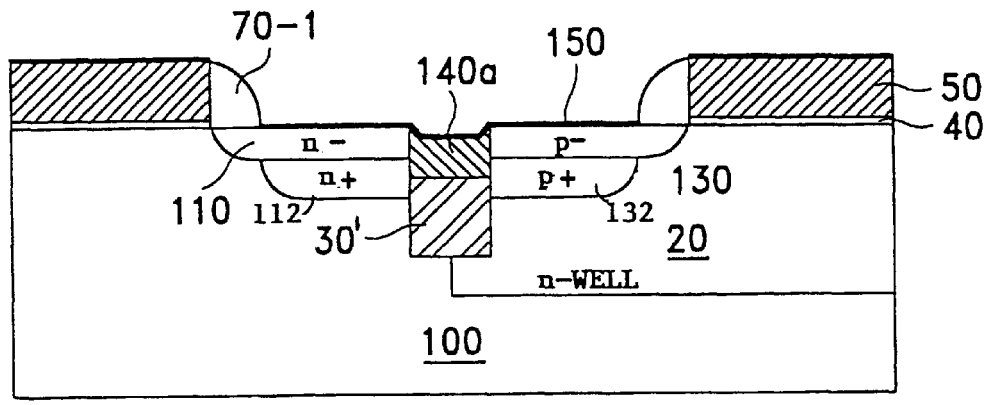

Referring now to FIG. 15, the photoresist layer 120 is removed. As shown in FIG. 16, a second conductive layer, such as a titanium silicide layer 150, is formed on the face of the integrated circuit substrate 100, extending from on the first active region 110 to the first conductive layer 140a and onto the second active region 130. Thus, the storage node of an SRAM cell may be formed. The n-type active region 110 is electrically connected to the p-type active region 130 using the polysilicon plug 140a. Therefore, separate contact areas need not be used so that the cell size may be reduced. Moreover, a parasitic p-n diode may be formed at the junctions between the doped polysilicon plug 140a in the adjacent active regions 110 and 130 which can degrade the electrical contact between the active regions 110 and 130. However, the silicide layer 150 can prevent a degraded contact.

In particular, if the plug polysilicon layer 140a is doped with n-type impurities, a parasitic p-n diode may be formed with the p-type active region 130. However, the suicide layer 150 directly connects the p-type active region 130 to the n-type region 110, so that the parasitic diode may be reduced or eliminated. Thus, the formation of a parasitic p-n diode can be prevented by the second conductive layer, to thereby form a high quality storage node between the p-type active region 130 and the n-type active region 110.

FIGS. 17–22 illustrate fabrication of isolation and interconnection structures according to another embodiment of the present invention. Fabrication proceeds as was already described in connection with FIGS. 2–10. Then, in FIG. 17, a photoresist layer 90 is formed and selectively patterned to cover n-well 20 and the gate 50 thereon, but to expose the sidewall of the isolating region 30. As shown, n-type dopants such as phosphorus or arsenic ions are implanted at an oblique angle with respect to the substrate face. This implantation is also referred to as symmetrical ion implantation.

Figure 17:
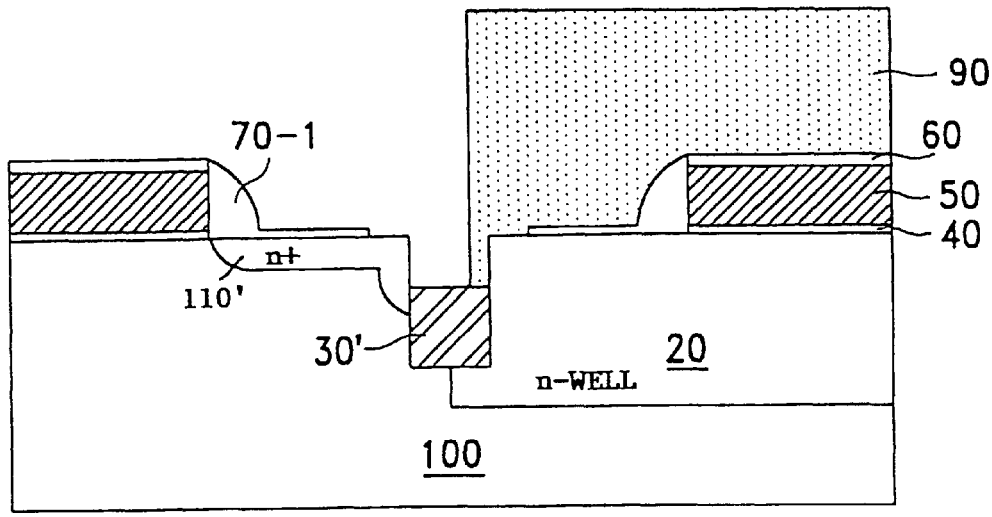
FIGS. 17–22 are cross-sectional views illustrating fabrication of isolation and interconnection structures for storage nodes of CMOS SRAM cells according to a second embodiment of the present invention.

Thus, an n-type active region 110' is formed, as shown in FIG. 17. In contrast with the earlier embodiment, the active region 110' is formed using symmetrical ion implantation, prior to forming the plug polysilicon layer 140a. Thus, the active region 110 is formed along the sidewall of the isolation region 30 as well.

Figure 18:
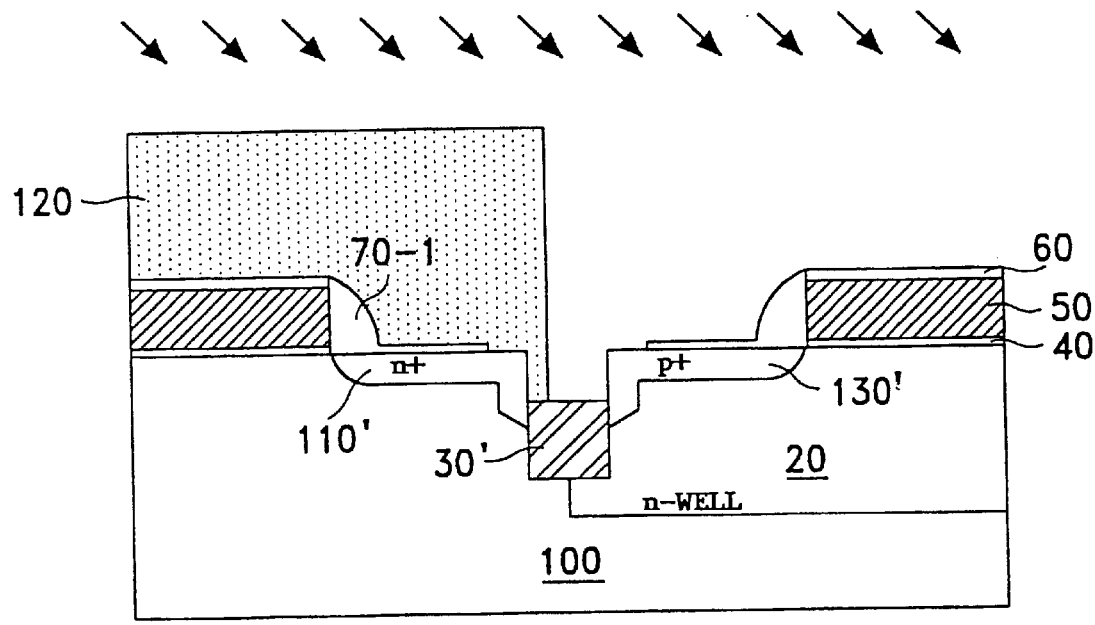

As shown in FIG. 18, a second photoresist layer 120 covers the n-type active region 110'. Then, p-type impurities such as boron or indium are symmetrically implanted into the n-well 20 using the photoresist layer 120 as a mask to form p-type active region 130'. It will be understood that the ion implantation need not be symmetrical as long as it is oblique.

Figure 19:
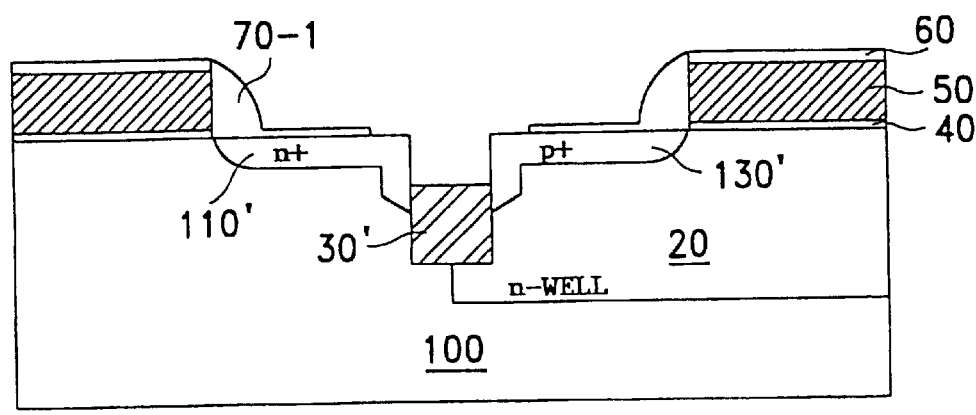
Figure 20:
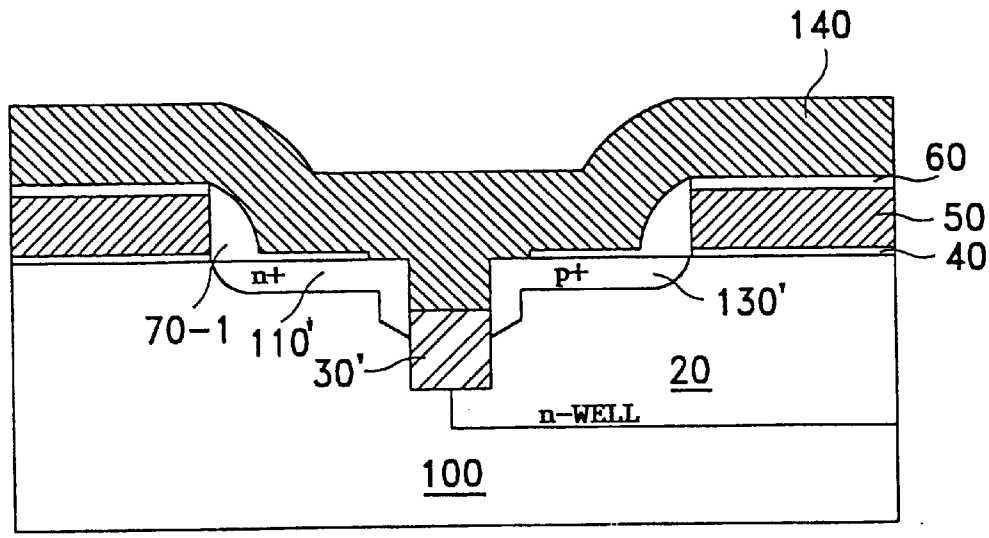
Figure 21:
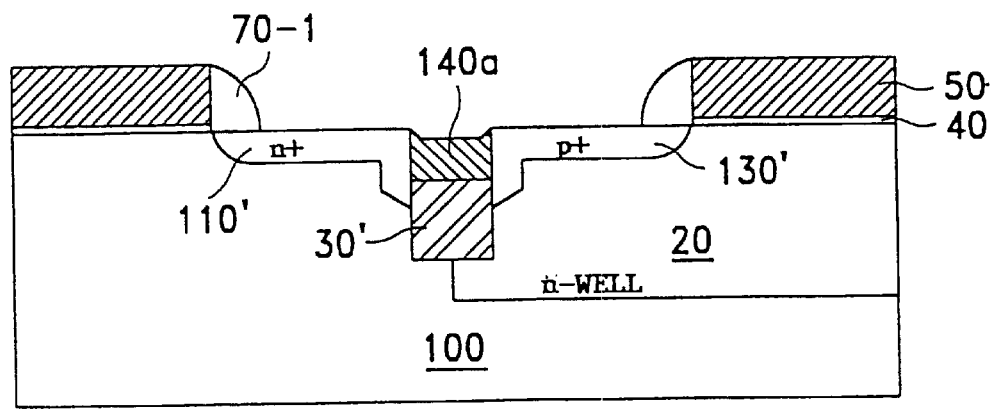
Figure 22:
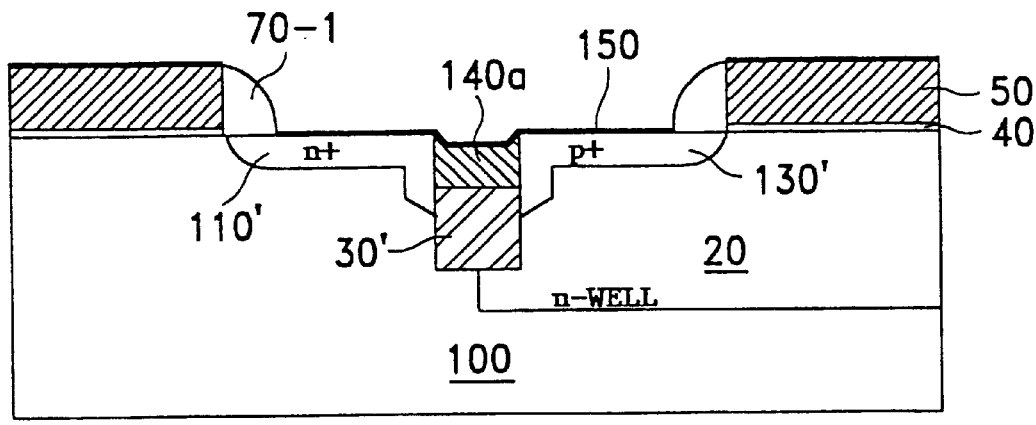

Then, referring to FIG. 19, the photoresist layer 120 is removed. As shown in FIG. 20, the second conductive layer is formed by forming a polysilicon layer 140 and then etching the polysilicon layer in FIG. 21 so as to form the plug polysilicon layer 140a. In FIG. 22, a titanium silicide layer 150 is formed in the exposed surface between the spacers 70-1, using the spacers 70-1 as a mask.

Accordingly, in the embodiment of FIG. 22, the active regions 110' and 13' are formed deep enough to completely cover the sidewalls of the second conductive layer 140a buried in the trench. Therefore, if the ions are implanted at a low energy, the active regions 110' and 130' are shallow at the surface thereof and deep along the sidewalls of the isolating region 120. Improved interconnect structures may thereby be provided.

FIGS. 23–26 illustrate other embodiments of the present invention. However, it will be understood that many other variations and/or modifications to the basic inventive concept can be made without departing from the spirit and scope of the present invention.

Figure 23:
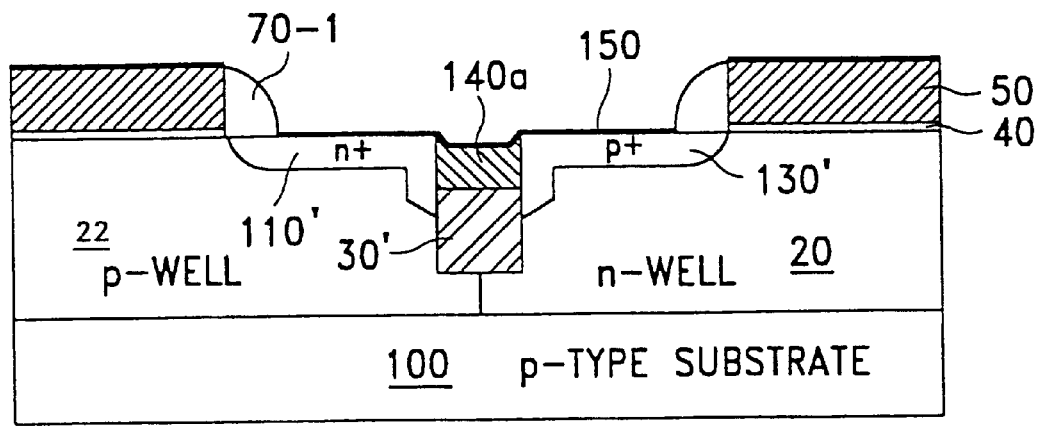
FIGS. 23–26 are cross-sectional views illustrating fabrication of isolation and interconnection structures for a storage nodes of CMOS SRAM cells according to a third embodiment of the present invention.
Figure 24:
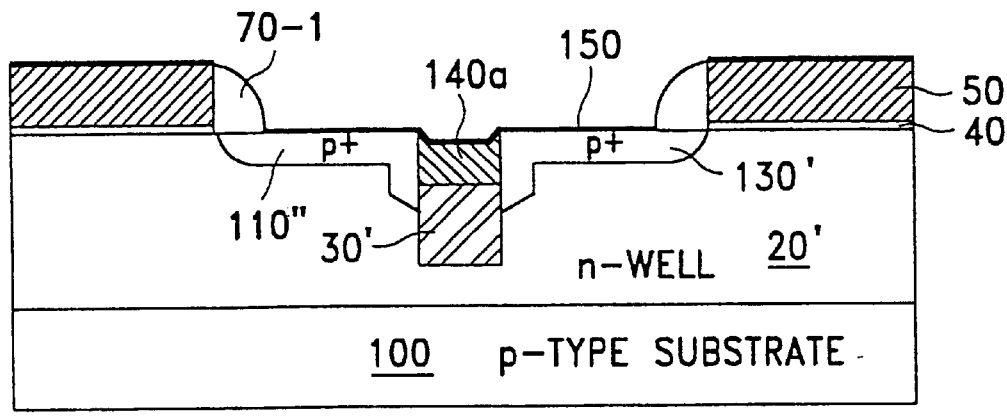
Figure 25:
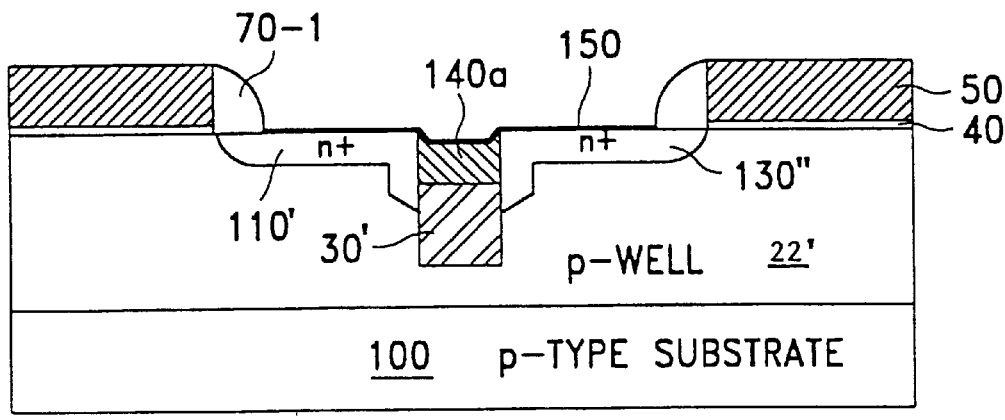
Figure 26:
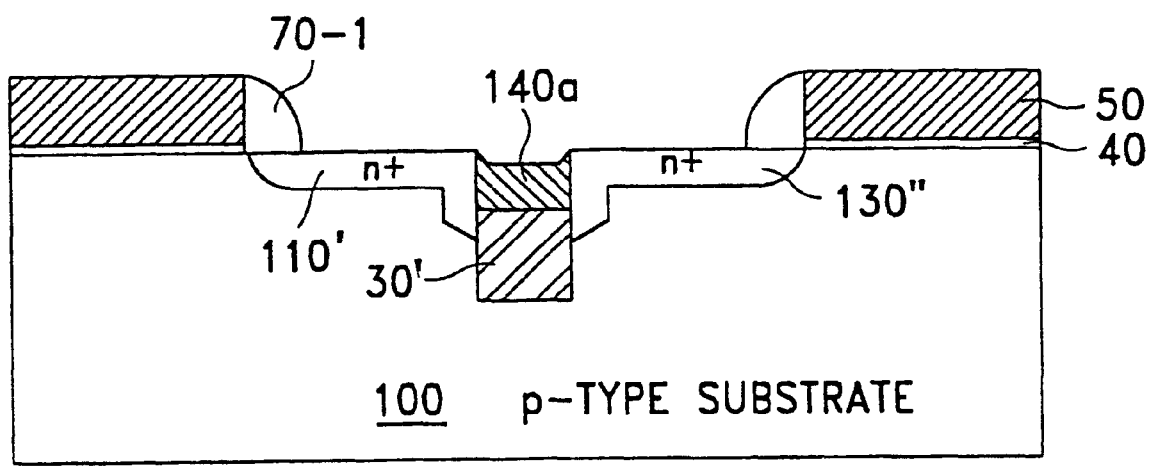

For example, as shown in FIG. 23, the conductivity type of the active regions may be varied. An n-type active region 110 may include a p-well 22 formed thereunder as shown in FIG. 23. Moreover, the active regions 110 and 130 may have the same conductivity types as shown in FIGS. 24 and 25 by implanting the same impurities without using the photoresist layers 90 and 120. Thus, in FIG. 24, the active regions 110" and 130' are both p-type, and in FIG. 25, the active regions 110' and 130" are both n-type. In FIG. 24, since active regions 110" and 130' have the same p-conductivity type, and an n-well 20' can be formed on the entire p-type substrate 100. In contrast, as shown in FIG. 25, when the active regions 110' and 130" are both n-type, a p-well 22' can be formed on the p-type substrate 100. Moreover, as shown in FIG. 26, it may be possible to form the active regions 110' and 130" without forming any kind of well on the substrate 100.

Accordingly, a first conductive layer is formed on a recessed isolation region to electrically contact active regions. The integration density of integrated circuit devices may be increased while providing high performance isolation and interconnection structures.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A complementary transistor structure for an integrated circuit comprising:

an n-channel transistor and a p-channel transistor in an integrated circuit, at a face thereof;

a recessed isolation region in the integrated circuit, between the n-channel transistor and the p-channel transistor, the recessed isolation region including a pair of spaced-apart laterally extending surfaces, both of which are recessed beneath the face; and a first conductive layer on the recessed isolation region, the first conductive layer extending between the n-channel transistor and the p-channel transistor beneath the face, and electrically connecting the n-channel transistor and the p-channel transistor beneath the face.

2. A complementary transistor structure according to claim 1 further comprising:
a second conductive layer on the face, extending from on the n-channel transistor onto the first conductive layer and onto the p-channel transistor.

3. A complementary transistor structure according to claim 1 wherein the first conductive layer comprises a doped polysilicon plug.

4. A complementary transistor structure according to claim 2 wherein the second conductive layer comprises a metal layer.

5. A complementary transistor structure according to claim 1 wherein the n-channel transistor and the p-channel transistor extend deeper into the integrated circuit adjacent the recessed isolation region, than does the first conductive layer on the recessed isolation region.

6. A complementary transistor structure according to claim 1 wherein the recessed isolation region comprises a recessed oxide filled trench.

7. An interconnection structure for an integrated circuit comprising:
first and second spaced apart active regions in an integrated circuit, at a face thereof;
a recessed isolation region in the integrated circuit, between the first and second spaced apart active regions, the recessed isolation region including a pair of spaced-apart laterally extending surfaces, both of which are recessed beneath the face; and
a first conductive layer on the recessed isolation region, the first conductive layer extending between the first and second spaced apart active regions beneath the face, and electrically connecting the first and second spaced apart active regions beneath the face.

8. An interconnection structure according to claim 7 further comprising:
a second conductive layer on the face, extending from on the first active region onto the first conductive layer and onto the second active region.

9. An interconnection structure according to claim 7 wherein the first conductive layer comprises a doped polysilicon plug.

10. An interconnection structure according to claim 8 wherein the second conductive layer comprises a metal layer.

11. An interconnection structure according to claim 7 wherein the first and second spaced apart active regions extend deeper into the integrated circuit adjacent the recessed isolation region, than does the first conductive layer on the recessed isolation region.

12. An interconnection structure according to claim 7 wherein the recessed isolation region comprises a recessed oxide filled trench.

13. An interconnection structure according to claim 7 wherein the first and second spaced apart active regions comprise first and second complementary conductivity active regions.

14. A storage node for an integrated circuit memory cell, the storage node electrically connecting an n-channel transistor and a p-channel transistor in an integrated circuit at a face thereof, the storage node comprising:
a recessed isolation region in the integrated circuit, between the n-channel transistor and the p-channel transistor, the recessed isolation region including a pair of spaced-apart laterally extending surfaces, both of which are recessed beneath the face; and
a first conductive layer on the recessed isolation region, the first conductive layer extending between the n-channel transistor and the p-channel transistor beneath the face, and electrically connecting the n-channel transistor and the p-channel transistor beneath the face.

15. A storage node according to claim 14 further comprising:
a second conductive layer on the face, extending from on the n-channel transistor onto the first conductive layer and onto the p-channel transistor.

16. A storage node according to claim 14 wherein the first conductive layer comprises a doped polysilicon plug.

17. A storage node according to claim 15 wherein the second conductive layer comprises a metal layer.

18. A storage node according to claim 14 wherein the n-channel transistor and the p-channel transistor extend more deeply into the integrated circuit adjacent the recessed isolation region, than does the first conductive layer.

19. A storage node according to claim 14 wherein the recessed isolation region comprises a recessed oxide filled trench.

20. An integrated circuit memory cell comprising:
a pair of cross-coupled inverters in an integrated circuit, each cross coupled inverter comprising:
an n-channel transistor and a p-channel transistor in the integrated circuit, at a face thereof;
a recessed isolation region in the integrated circuit, between the n-channel transistor and the p-channel transistor, the recessed isolation region including a pair of spaced-apart laterally extending surfaces both of which are recessed beneath the face; and
a first conductive layer on the recessed isolation region, the first conductive layer extending between the n-channel transistor and the p-channel transistor beneath the face, and electrically connecting the n-channel transistor and the p-channel transistor beneath the face.

21. An integrated circuit memory cell according to claim 20 further comprising:
a second conductive layer on the face, extending from on the n-channel transistor onto the first conductive layer and onto the p-channel transistor.

22. An integrated circuit memory cell according to claim 20 wherein the first conductive layer comprises a doped polysilicon plug.

23. An integrated circuit memory cell according to claim 21 wherein the second conductive layer comprises a metal layer.

24. An integrated circuit memory cell according to claim 20 wherein the n-channel transistor and the p-channel transistor extend into the integrated circuit adjacent the recessed isolation region, than does the first conductive layer on the recessed isolation region.

25. An integrated circuit memory cell according to claim 20 wherein the recessed isolation region comprises a recessed oxide filled trench.

* * * * *